United States Patent [19]

McDermott

[11] Patent Number: 4,713,653
[45] Date of Patent: Dec. 15, 1987

[54] HIGH VOLTAGE PROTECTOR

[75] Inventor: Julian A. McDermott, Ridgewood, N.Y.

[73] Assignee: Julian A. McDermott Corp., Ridgewood, N.Y.

[21] Appl. No.: 792,183

[22] Filed: Oct. 28, 1985

Related U.S. Application Data

[63] Continuation of Ser. No. 428,496, Sep. 29, 1982, abandoned.

[51] Int. Cl.<sup>4</sup> ............................................. G08B 21/00
[52] U.S. Cl. .................................... 340/654; 340/660; 246/129; 324/133
[58] Field of Search ............... 340/660, 652, 664, 47; 324/133, 51, 72.5; 246/31, 81, 129, 1 C, 28 F; 339/12 R

[56] References Cited

U.S. PATENT DOCUMENTS

| | | | |
|---|---|---|---|
| 3,404,340 | 10/1968 | LaBrie | 324/72.5 |
| 3,531,790 | 9/1970 | Staley | 340/660 X |
| 3,810,258 | 5/1974 | Mathauser | 339/12 R |
| 3,831,089 | 8/1974 | Pearce | 324/133 X |
| 3,870,952 | 3/1975 | Sibley | 246/28 F X |
| 3,962,630 | 6/1976 | Chaffee | 324/133 X |
| 3,967,257 | 6/1976 | Hager | 340/664 |
| 4,225,817 | 9/1980 | Kahlden | 324/133 |
| 4,233,560 | 11/1980 | Blenman | 324/133 |
| 4,356,442 | 10/1982 | Beha | 324/133 X |
| 4,366,434 | 12/1982 | Ellis | 324/133 X |
| 4,506,260 | 3/1985 | Woodruff et al. | 340/652 X |

FOREIGN PATENT DOCUMENTS 419932  8/1974  U.S.S.R. ................................ 340/47

*Primary Examiner*—James L. Rowland
*Assistant Examiner*—Brian R. Tumm
*Attorney, Agent, or Firm*—Martin LuKacher

[57] ABSTRACT

Apparatus for warning workers on electrified railroad tracks that the third rail is live having visual and/or aural alarms, sensing electrodes or contactors for deriving power for activating alarms from the third rail, and circuits for providing visual and/or aural alarms indicating that the contactors have not made proper contact with the rails to assure the workers that the warning apparatus is properly operating as a high voltage protector.

9 Claims, 4 Drawing Figures

HIGH VOLTAGE PROTECTOR

DESCRIPTION

This is a continuation of application Ser. No. 06/428,496 filed 9/29/82, now abandoned.

The present invention relates to apparatus for warning workers who may come in close proximity to a high voltage power source that it is live and that they are in danger and more particularly, to high voltage protector apparatus for use in electrified railways, such as subways, to provide warnings that the third rail is live and that the danger of electrocution upon coming into contact with the third rail is present.

BACKGROUND AND SUMMARY

A high voltage protector must be portable and particular attention must be given to assure that electrical contacts are certain and that the protector functions when installed at the work site. Contacts and connections to the high voltage member, by which is meant the third rail or other high voltage conductor or power source which may be exposed and with which the workers may come into contact, must be certain. The work site also may contain return members or conductors, such as the track along which the train travels, which is at return or ground potential. Contact to the return member must also be certain when the return member functions as part of the warning and high voltage protection system.

It is an object of this invention to provide improved warning apparatus for protection of workers who may come in close proximity to a high voltage source, such as the third rail at an electrified railroad work site.

It is a further object of the invention to provide warning apparatus which provides a visual warning of high intensity to demand attention if a high voltage conductor, such as the third rail, is energized and live.

It is a still further object of the present invention to provide warning apparatus which provides an aural signal to attract attention if a high voltage power source such as a third rail is energized and live.

It is a still further object of the present invention to provide warning and high voltage protection apparatus which provides both high intensity visual and aural warning signals to workers who may be exposed to a high voltage member, such as a third rail.

It is a still further object of the present invention to provide warning apparatus for use at work sites where high voltage conductors are present which provides visual and/or aural signals which assure that contacts to the high voltage member and if necessary, to the return or ground members, is made such that the workers are aware that the warning apparatus is properly installed and operative.

It is a still further object of the present invention to provide improved warning apparatus for use at work sites where workers may be exposed to high voltage members which assures making of quick, safe and reliable contact to the members.

The foregoing and other objects, features and advantages of the invention will become more apparent from the reading of the following description in connection with the accompanying drawings in which:

DETAILED DESCRIPTION

Figure 1:
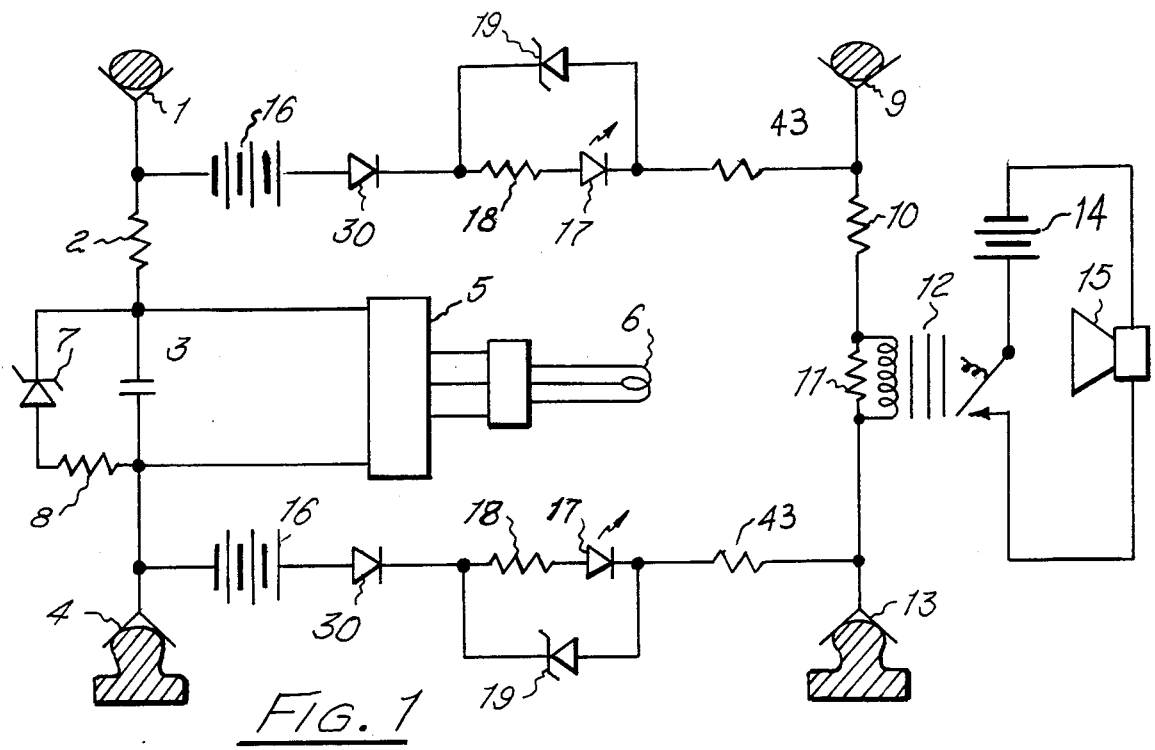
FIG. 1 is a schematic diagram showing the circuitry of warning apparatus embodying the invention which provides both visual and aural warning signals.

Referring to FIG. 1, a pair of sensing means in the form of contactor electrodes 1 and 4 are provided for the third rail and the track rail of an electrified railway. The third rail is shown as an elipse in the drawing and the track rail or running rail is shown sectioned in the drawing. A resistor 2 is provided through which a capacitor 3 is charged. A trigger circuit 5 provides intermittently, a momentary high voltage to a strobe lamp 6 so that the capacitor 3 is discharged through the lamp 6. A zener diode 7 and a resistor 8 prevents the capacitor 3 from reaching an excessively high voltage. The power to operate the strobe lamp 6 is taken directly from the third rail via the resistor 2. This power charges the capacitor 3. The trigger circuit 5 provides the voltage to intermittently discharge the capacitor 3 through the lamp 6.

Preferably, in the same carrying case that contains the strobe lamp and other components of the apparatus, an aural warning device 15 such as a horn or siren, may be included. The sensing means includes an electrode 9 which provides a contactor and which contacts and makes a connection to the high voltage conductor (the third rail). Another electrode 13 of the sensing means provides a contactor which makes contact to the return member or track rail. Accordingly, there is a pair of electrodes which provide a pair of connections to the third rail, and another pair of electrodes 4 and 13 which provide a pair of connections to the return rail.

Voltage dividing resistors 10 and 11 are connected between the electrodes 9 and 13. A relay 12 is connected across the resistor 11. When power is applied between the electrodes 9 and 13 the relay 12 is activated so as to close its normally open contacts. These relay contacts are in series circuit with a battery 14 and the aural warning device 15. Accordingly, both a high intensity visual alarm and an aural alarm will be provided by the warning system, if the third rail is live.

Unfortunately, the high voltage is usually off and the third rail is dead when the electrodes are placed on the third rail and on the track rail. In order to make certain that the warning apparatus is installed properly and the contacts made by the electrodes are certain, additional supervisory circuits are used. These circuits are connected between the electrodes 1 and 9 which provide a pair of connections to the third rail and the electrodes 4 and 13 which provide a pair of connections to the track rail. Each of these circuits is similar and contains a battery 16, a light-emitting diode (LED) 17, resistors 18 and 43 and zener diode 19. The resistors 18 and 43 and diode 19 provide a bypass, voltage limiting circuit to protect the LED 17. Another diode 30 may be used in the circuits to protect against reverse currents and shock.

When the pairs of electrodes 1 and 9 and 4 and 13 are connected, the LEDs 17 are illuminated, and assurance is had that the contact to the rails 1 and 9, and 4 and 13 is certain because the circuit providing operating current to the LEDs is completed through the rails. If a double electrode method of assuring contact is not deemed necessary, both the aural alarm 15 and the visual alarm 6 may be connected to a single electrode for each polarity. The system may also be used for alternating current by providing necessary rectifying diodes in the circuits.

Figure 2:
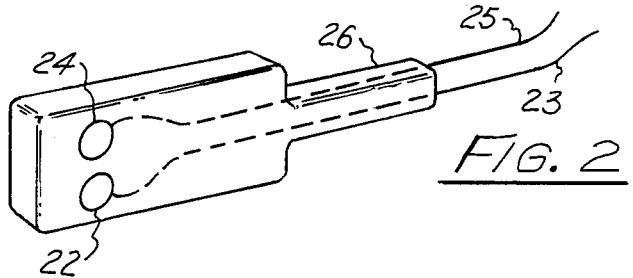
FIG. 2 is a perspective view showing an electrical contactor containing sensing means with electrodes for contacting either a high voltage member or a return member, particularly the third rail or a track at a railway work site where the warning apparatus shown in FIG. 1, FIG. 2, or FIG. 3 may be installed.

Referring to FIG. 2, there is shown the construction of a typical electrode assembly. A pair of electrodes 22 and 24 is mounted on an insulating handle 26. Wires 23 and 25 are brought out to the handle. The electrodes may be magnetically attached to the rails or may themselves be magnets. The handle may be of any shape to conform to the shape of the rails and the electrodes may be connected to the sides, bottom or top of the rails.

Figure 3:
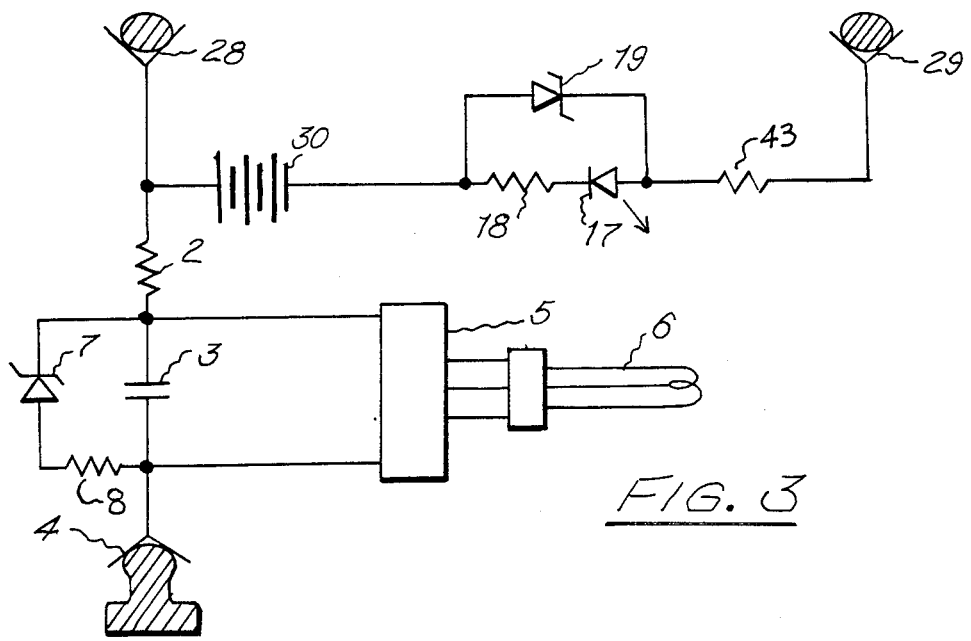
FIG. 3 is a schematic diagram showing circuitry of warning apparatus in accordance with another embodiment of the invention.

Referring to FIG. 3, there is shown a method of assuring contact to the rails where the warning apparatus has only one warning mode; in this illustration, a visual warning mode. The arrangement for only one polarity is shown although the same arrangement applies to both polarities. The parts in FIG. 3 which are like those in FIG. 1 are indicated by the same reference numerals except for the electrodes 28 and 29 for the third rail.

Figure 4:
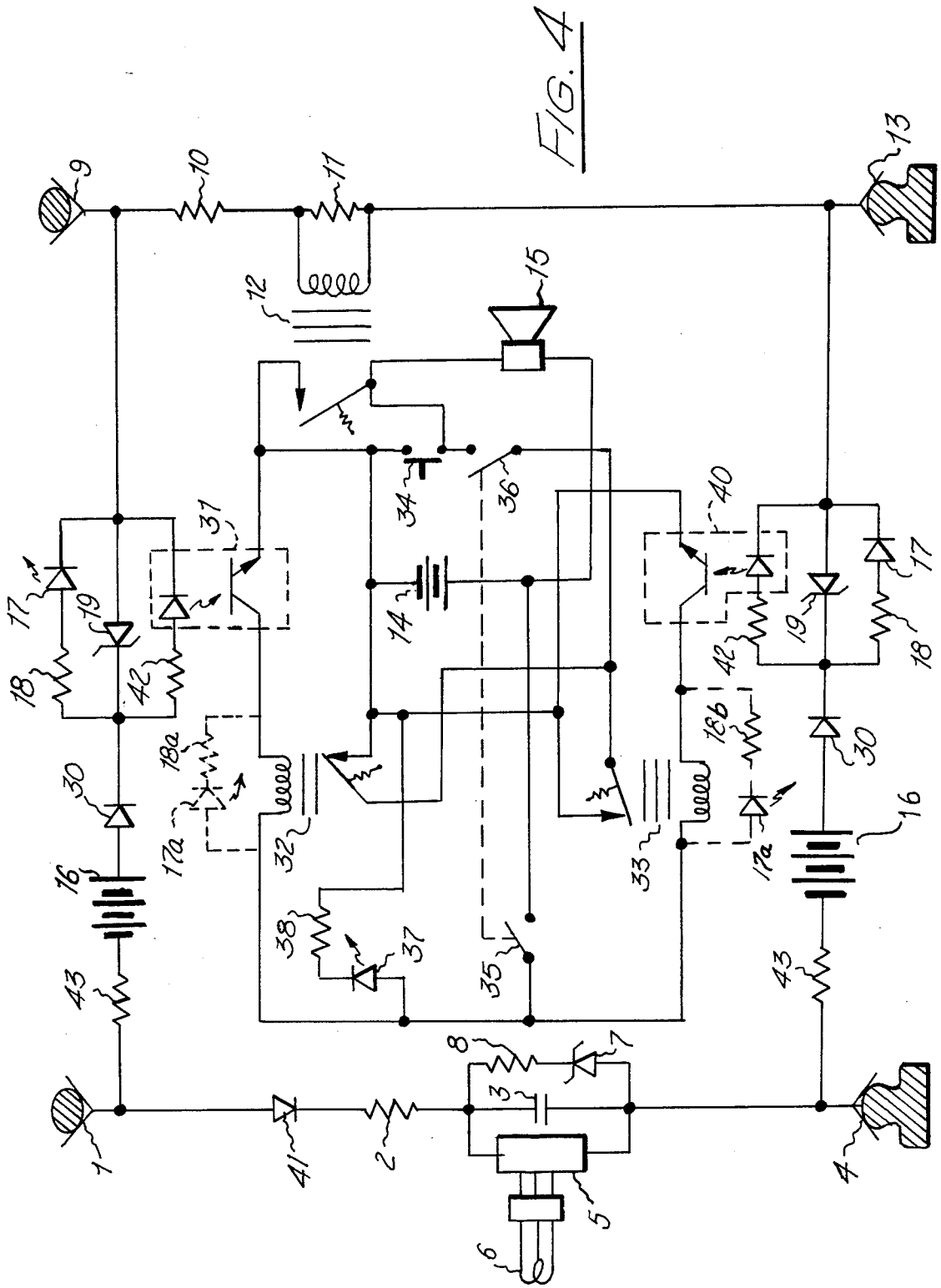
FIG. 4 is a schematic diagram showing circuitry of warning apparatus in accordance with still another embodiment of the invention which provides additional safeguards against defective contacts to a high voltage member and a return member, particularly the third rail and the track of an electrical railway.

Referring to FIG. 4, there is shown another circuit which is generally similar to the circuit shown in FIG. 1 and like parts of both circuits are indicated by like reference numerals. An additional safeguard for reliability is provided in that after the connection is made to the rails, if the electrodes are accidentally removed, the aural warning device 15 will sound.

In FIG. 4, in addition to the light-emitting diode 17, optoelectric couplers 31 and 40 having a light-emitting diode and a phototransistor are also included. These couplers or "optos" are connected to relays 32 and 33. When the apparatus is not in use, a double pole, single throw switch represented by contacts 35 and 36 is left open. When the electrodes are in place (assuming there is no power on the tracks which if present would activate strobe lamp 6), this switch 35, 36 is closed. Another light-emitting diode 37 in series with a resistor 38 indicates that the switch 35, 36 is closed. The circuits between the rail contact electrodes 1 and 9 and 4 and 13 may use the current limiting resistors 43. The light-emitting diodes 17 desirably are selected to produce light of a different color than the other light-emitting diode 37 to indicate that the disconnecting of the contact electrodes could activate the aural alarm 15.

In operation, the electrodes 1 and 9 and 4 and 13, when properly connected, would have caused the LEDs 17 to become illuminated with power from the batteries 16. At the same time the optos 37 and 40 would have become conductive. The result is the opening of the contacts of the relays 32 and 33. If at this time, when the LEDs 17 are operating, the swtich 35, 36 is closed, and LED 37 would indicate that the disconnect alarm is operative.

If an electrode which affects the operation of the device such as electrode 1 is removed from the third rail, the opto 31 becomes inoperative. As a result the relay 32 closes its contacts which causes the operation of the aural alarm.

A push button switch 34 may be used to provide a manual control for the siren and to test the audible signal. A diode 41 is provided to protect against inadvertent voltage reversal and also makes the system useful on AC circuits. Instead of the light-emitting diodes 17 and their series resistors 18, light-emitting diode 17a and resistor 18a may alternatively be connected across the coils of the relays 32 and 33 to perform the same function. The switch 35 would be eliminated and the circuit closed at its location. The diode 37 with resistor 38 would be eliminated. However there would be no visible indication that the disconnect alarm is ready to operate.

Where power or voltage factors demand, further resistors or solid state amplification may be used throughout.

From the foregoing description it will be apparent that there has been provided improved apparatus for providing warnings in the event of dangerous high voltage conditions from an exposed high voltage member, such as the third rail so, as to provide a high voltage protector. Variations and modifications in the herein described apparatus, within the scope of the invention, will undoubtedly suggest themselves to those skilled in the art. Accordingly, the foregoing description should be taken as illustrative and not in a limiting sense.

I claim:

1. Apparatus for warning that an exposed member carrying high voltage is live, which comprises means for providing a first alarm when electrical energy is applied thereto, sensing means connecting said alarm providing means to said high voltage member and to a member at return potential to apply electrical energy to said alarm providing means from said high voltage member thereby causing operation of said first alarm providing means when said high voltage member is live, said sensing means including contactor means attachable to said high voltage member and to said member at return potential and having a means for providing a pair of connections to said high voltage member, means for providing a second alarm depending upon whether a circuit therethrough is completed for verifying the connection of said first alarm providing means to said high voltage member, one of said pair of connections being connected in common to said first alarm providing means and to said second alarm providing means, the other of said pair of connections being connected to said second alarm providing means to complete said circuit therethrough when both of said pair of connections are connected to said high voltage member, said contactor means including means for providing a second pair of connections to said member at return potential, means for providing a third alarm when a circuit therethrough is completed, and means connecting said third alarm providing means to said second pair of connections for completing said circuit therethrough when both connections of said second pair of connections are connected to said return potential member for verifying the connection of said first alarm providing means thereto.

2. The apparatus for warning that an exposed member carrying high voltage is live, which comprises means for providing a first alarm when electrical energy is applied thereto, sensing means connecting said alarm providing means to said high voltage member and to a member at return potential to apply electrical energy to said alarm providing means from said high voltage member thereby causing operation of said first alarm providing means when said high voltage member is live, said sensing means including contactor means attachable to said high voltage member and to said member at return potential and having means for providing a pair of connections to said high voltage member, means for providing a second alarm depending upon whether a circuit therethrough is completed for verifying the connection of said first alarm providing means to said high voltage member, one of said pair of connections being connected in common to said first alarm providing means and to said second alarm providing means, the other of said pair of connections being connected to said second alarm providing means to complete said circuit therethrough when both of said pair of connections are connected to said high voltage member, said second alarm providing means including relay means having normally closed contacts, an alarm device, a battery, said relay means contacts, said alarm device and said battery being connected in series, means operative upon completion of said circuit between said pair of connections through said high voltage member for activating said relay means to open said first contacts, said sensing means also including second contactor means for providing a second pair of connections to said return member, second relay means having normally closed contacts, a second alarm device, a second battery, said second relay means contacts, said second alarm device and said second battery being connected in series, and means operative upon completion of said circuit between said second pair of connections through said return member for activating said second relay means to open said contacts.

3. A device for providing warnings that a high voltage third rail is live to personnel in the vicinity of the third rail, said device including signal means, means connecting said signal means to said third rail to ensure contact thereof with said third rail, said contact assurance means including means for passing and monitoring a local current transmitted through said rails and including contactors attachable to said rails, an insulated handle on which said contactors are mounted, magnetic means for temporarily attaching said handle and said contactors to said third rail, and wiring connecting said contactors to said signal means and to said means for transmitting and monitoring said local current.

4. The invention as set forth in claim 3 wherein said contactors are provided by a pair of electrical contacts; said local current passing and monitoring means comprising relay means and battery means connected to said contactors, an alarm circuit for operating an alarm, said relay means opening the alarm circuit when a circuit thereto is completed from said battery means by the attachment of the contactors to the third rail, said current passing and monitoring means also including means for closing said alarm circuit for operating the alarm when at least one of said contactors is removed.

5. In a device to warn of the presence of high voltage in a conductor, the combination comprising: a first warning means connected between said conductor and a return potential conductor and responsive to voltage between said high voltage conductor and return potential conductor; a second and independent warning means connected between said high voltage conductor and return potential conductor and responsive to voltage between said high voltage conductor and said return potential conductor; a third warning means connected between the high voltage conductor where the first warning means is connected thereto and the high voltage conductor where the second warning means is connected thereto, including a battery, and relay means, said relay means being so connected as to cause the activation of a warning alarm means if a circuit between the high voltage connection of the first warning means and the high voltage connection for the second warning device is incomplete; a fourth warning means connected between the return potential conductor where the first warning means is connected thereto and the return conductor where the second warning means is connected thereto, said fourth warning means including a second battery and second relay means, said second relay means being so connected as cause the activation of said fourth warning alarm means if the circuit between the return connection for the first warning device and the return connection for the second warning means is incomplete.

6. A device according to claim 5 wherein the first warning means is a visual alarm and the second warning means is an aural alarm.

7. Apparatus for warning that an exposed member carrying high voltage is live, which comprises means for providing a first alarm when electrical energy is applied thereto, sensing means connecting said alarm providing means to said high voltage member and to a member at return potential to apply electrical energy to said alarm providing means from said high voltage member thereby causing operation of said first alarm providing means when said high voltage member is live, said sensing means including contactor means attachable to said high voltage member and to said member at return potential and having means for providing a pair of connections to at least one of said high voltage member and said member at return potential, means for providing a second alarm depending upon whether a circuit therethrough is completed for verifying the connection of said first alarm providing means to said high voltage member, one of said pair of connections being connected in common to said first alarm providing means and to said second alarm providing means, the other of said pair of connections being connected to said second alarm providing means to complete said circuit therethrough when both of said pair of connections are connected to said one of said high voltage and return potential members, said contactor means comprising first and second contactors, said first contactor including said means for providing said pair of connections to said high voltage member, said second contactor having means providing a second pair of connections to said return potential member, and third alarm providing means connected to one of said second pair of connections in common with said first alarm providing means and also to the other of said second pair of connections for providing a third alarm depending upon whether a circuit therethrough is completed for verifying the connection of said first alarm providing means to said return member.

8. Apparatus according to claim 7 wherein said second and third alarm providing means each comprises a sensing circuit including a battery and an LED which are activated when said circuits between said first named and second pairs of connections are completed.

9. A system for the protection of individuals from shock from a high voltage member, said system comprising a contactor attachable to said high voltage member for making twin independent contacts to said high voltage member; a separate contactor with twin independent contacts to make contact with a return potential member; a capacitor, and wiring connections to conduct current from one of the twin contactors at said high voltage member to one of said twin contactors at said return member so as to cause said capacitor to charge; a strobe signal lamp, and a trigger circuit to fire the capacitor repetitiously through said strobe signal lamp; an aural alarm, and battery and relay means connected between the other of said twin contactors at said high voltage member and the other of said twin contactors at said return member to activate the aural alarm, if when said contactors are directly connected together by contact with the high voltage conductor or its return member, said connection is broken.

* * * * *

UNITED STATES PATENT AND TRADEMARK OFFICE
CERTIFICATE OF CORRECTION

PATENT NO.   : 4,713,653

DATED        : December 15, 1987

INVENTOR(S)  : Julian A. McDermott

It is certified that error appears in the above-identified patent and that said Letters Patent are hereby corrected as shown below:

On the front page of the patent, delete

[73]   Julian A. McDermott Corp.
           Ridgewood, New York

Signed and Sealed this

Thirty-first Day of May, 1988

Attest:

DONALD J. QUIGG

Attesting Officer

Commissioner of Patents and Trademarks